(12) United States Patent
Asano et al.

(10) Patent No.: US 6,873,828 B2
(45) Date of Patent: Mar. 29, 2005

(54) COMPOUND SEMICONDUCTOR SWITCHING DEVICE FOR HIGH FREQUENCY SWITCHING

(75) Inventors: Tetsuro Asano, Oizumi-machi (JP); Takayoshi Higashino, Neyagawa (JP); Koichi Hirata, Ashikaga (JP)

(73) Assignee: Sanyo Electric Co., Ltd., Osaka (JP)

( * ) Notice: Subject to any disclaimer, the term of this patent is extended or adjusted under 35 U.S.C. 154(b) by 662 days.

(21) Appl. No.: 09/855,030

(22) Filed: May 15, 2001

(65) Prior Publication Data

US 2002/0024375 A1 Feb. 28, 2002

(30) Foreign Application Priority Data

May 15, 2000 (JP) ........................................ 2000-141387

(51) Int. Cl.[7] .................................................. H04B 1/44
(52) U.S. Cl. ......................................... 455/78; 333/100
(58) Field of Search ............................ 455/73, 78, 79, 455/83; 333/100, 101; 327/365, 427

(56) References Cited

U.S. PATENT DOCUMENTS

| | | | | |
|---|---|---|---|---|
| 5,081,706 A | * | 1/1992 | Kim ............................ | 455/78 |
| 5,548,239 A | | 8/1996 | Kohama | |
| 5,698,875 A | | 12/1997 | Varmazis | |
| 5,715,525 A | * | 2/1998 | Tarusawa et al. ........... | 455/101 |
| 5,881,369 A | * | 3/1999 | Dean et al. .................... | 455/78 |
| 5,999,824 A | * | 12/1999 | Na ........................... | 455/553.1 |
| 6,281,762 B1 | * | 8/2001 | Nakao et al. ................ | 333/103 |
| 6,560,443 B1 | * | 5/2003 | Vaisanen et al. .............. | 455/73 |

FOREIGN PATENT DOCUMENTS

| | | |
|---|---|---|
| JP | 6-29811 | 2/1994 |
| JP | 6-334506 | 12/1994 |
| JP | 7-303001 | 11/1995 |
| JP | 8-70245 | 3/1996 |
| JP | 8-195667 | 7/1996 |
| JP | 8-204528 | 8/1996 |
| JP | 8-204530 | 8/1996 |
| JP | 8-213891 | 8/1996 |
| JP | 2-557561 | 9/1996 |
| JP | 8-293776 | 11/1996 |
| JP | 9-55682 | 2/1997 |
| JP | 63-20041 | 4/1998 |

OTHER PUBLICATIONS

*Compact GaAs ICs For PHS*, Kaoru Nogawa et al. Sanyo Technical Review vol. 29, No. 1 Apr. 1997. pp52–59.
*High Power DPDT Antenna Switch MMIC For Digital Celluar Systems*, Kazumasa Kohama et al. IEEE Journal of Solid–State Circuits, vol. 31, No. 10, Oct. 1996.
*High Power Handling GaAs SWIC For GSM Application*, Noriyuki Ohbata et al. NEC Kansai Ltd. vol. 52 No. 3/1999. pp150–152.
Office Action from Taiwan Patent office dated Apr. 24, 2002.

* cited by examiner

Primary Examiner—Vivian Chin
Assistant Examiner—Sanh Phu
(74) Attorney, Agent, or Firm—Morrison & Foerster LLP

(57) ABSTRACT

A compound semiconductor switching device is based on a designing guideline that isolation should be assured by reducing the gate width of switching FET, thereby reducing the capacitance of the FET. Proper isolation between the two signal passes IS obtained with a FET gate width of about 700 $\mu$m or smaller at a signal frequency of about 2.4 GHz or higher, without employing a shunt FET.

11 Claims, 9 Drawing Sheets

PRIOR ART

PRIOR ART

COMPOUND SEMICONDUCTOR SWITCHING DEVICE FOR HIGH FREQUENCY SWITCHING

BACKGROUND OF THE INVENTION

1. Field of the Invention

The present invention relates to a compound semiconductor switching device for switching at high frequencies, especially to a compound semiconductor switching device used at a frequency of about 2.4 GHz or higher.

2. Discussion of the Related Art

Mobile communication devices such as mobile telephones often utilize microwaves in the GHz range, and commonly need a switching device for high frequency signals, which are used in switching circuits for changing antennas and switching circuits for transmitting and receiving such signals. A typical example of such a switching device can be found in Japanese laid-open patent publication No. Hei 9-181642. Such a device often uses a field-effect transistor (called FET hereinafter) made on a gallium arsenide (GaAs) substrate, as this material is suitable for use under high frequencies, and developments have been made in forming a monolithic microwave integrated circuit (MMIC) by integrating the aforementioned switching circuits.

FIG. 6(A) is a cross-sectional view of a conventional GaAs FET. The GaAs substrate 1 is initially without doping, and has, beneath its surface, an n-type channel region (or a channel layer) 2 formed by doping with n-type dopants. A gate electrode 3 is placed on the surface of the channel region 2 forming a Schottky contact, and two signal electrodes, namely a source electrode 4 and drain electrode 5, are placed on both sides of the gate electrode 3 forming ohmic contacts to the surface of the channel region 2. In this transistor configuration, a voltage applied to the gate electrode 3 creates a depletion layer within the channel region 2 beneath the gate electrode 3, and thus controls the channel current between the source electrode 4 and the drain electrode 5.

FIG. 6(B) shows the basic circuit configuration of a conventional compound semiconductor switching device, called a SPDT (Signal Pole Double Throw), using GaAs FETs. One of the two signal electrodes, which can be either a source electrode or a drain electrode, of each FET (FET1 being the first FET and FET2 being the second FET) is connected to a common electrode IN. Another of the two signal electrodes of each FET (FET1 and FET2) is connected to an output terminal OUT1 and OUT2). The gates of FET1 and FET2 are connected to the control terminals Ctl-1 and Ctl-2 through resistors R1 and R2, respectively. A complementary signal is applied to the first and second control terminals, Ctl-1 and Ctl-2. When a high level signal is applied to the control terminal of an FET, the FET changes into an on-state, and a signal passes from the common input terminal IN to the output terminal of the FET. The role of the resistors R1 and R2 is to prevent the leaking of the high frequency signals through the gate electrodes to the DC voltage applied on the control terminals (Ctl-1 and Ctl-2), which are grounded through capacitors.

An equivalent circuit of the aforementioned conventional compound semiconductor switching device is shown in FIG. 7. In microwave technology, the standard characteristic impedance is 50 Ω, and, thus, in this case the characteristic impedance of each terminal is 50 Ω (R1=R2=R3=50 Ω). With the voltages of the three terminals being represented by V1, V2, and V3, respectively, the insertion loss and the isolation are given by the following equations I and II:

$$\text{Insertion Loss} = 20\ \log(V2/V1)\ [\text{dB}] \quad [\text{I}]$$

$$\text{Isolation} = 20\ \log(V3/V1)\ [\text{dB}] \quad [\text{II}]$$

Equation I states the insertion loss expressed in dB when a signal is transmitted from the common input terminal IN to the output terminal OUT1, and equation II expresses the isolation between the common input terminal IN and the output terminal OUT2, also in dB.

In this type of compound semiconductor switching device, it is required that the insertion loss be minimized while improving the isolation, when one designs an FET which is inserted in series into the circuit. The reason a GaAs FET is used as the FET in this type of device is that GaAs has a higher electron mobility than silicon and thus a lower electrical resistance, making it easier to attain a low insertion loss, and that a GaAs substrate is a semi-insulating material suitable for attaining high isolation between the signal passes. On the other hand, GaAs substrates are more expensive than silicon substrates, and such devices cannot compete with silicon devices once a comparable device, such as a PIN diode, is made from silicon substrates.

In this type of compound semiconductor switching device, the electrical resistance R of the channel region 2 in the FET is given by the following expression in ohms:

$$R = 1/en\mu S\ [\Omega] \quad [\text{III}]$$

where e denotes the electric charge of an electron ($1.6\times10^{-19}$ C/cm$^3$), n the electron carrier concentration, $\mu$ the electron mobility, and S the surface area of the cross section of the channel region (cm$^2$).

As seen from equation III, the conventional guideline for designing such device is to maximize the gate width and thereby the cross-sectional area of the channel region, for reducing the electric resistance and thus the insertion loss.

However, the above configuration makes the capacitance of the Schottky contact between the gate 3 and the channel region 2 very large, and allows leakage of the high frequency input signal, resulting in a reduced degree of isolation. In the conventional design, shunt FETs are introduced into the circuit to prevent deterioration of the isolation.

FIG. 8 shows a circuit of a compound semiconductor switching device which has been used in commercial products. In this configuration, shunt FET3 and shunt FET4 are introduced between the output terminals OUT1, OUT2 of the switching FETs and the ground, such that the complementary signals from the control terminals Ctl-1 and Ctl-2 are applied on the gates of shunt FET3 and shunt FET4, respectively. As a result, when FET1 is in an on-state, shunt FET4 is also in an on-state while FET2 and shunt FET3 are in an off-state.

In this configuration, when the signal between the common input terminal IN and the output terminal OUT1 is switched on, and accordingly the signal between the common input terminal IN and the output terminal OUT2 is switched off, the input signal leaking to the output terminal OUT2 is directed to the ground through a capacitor C connected to the ground. Thus, it is possible to improve the isolation over the configuration without the shunt FETs.

In summary, the conventional design guideline for the compound semiconductor switching device is to increase the gate width in order to reduce the on-state resistance, thereby reducing the insertion loss. The large width of the gate electrode, however, leads to increased capacitance of the gate electrode, resulting in reduced isolation. Thus, it is inevitable that a shunt FET has to be introduced into the circuit for directing the leaking input signal to the ground for improving isolation.

Thus, the conventional compound semiconductor switching device has an extremely large chip size with the typical size being 1.07×0.50 mm². This is against the current semiconductor design trend in which cost reduction is sought by reducing the chip size. As a result, expensive compound semiconductor devices for switching have been replaced by the inexpensive silicon-based counterparts and has lost its share in the market.

SUMMARY OF THE INVENTION

Therefore, the present invention is directed to a compound semiconductor switching device, particularly at frequencies of about 2.4 GHz and higher, which has a significantly smaller chip size than the conventional device while maintaining low insertion loss and high isolation.

According to the present invention, there is provided a compound semiconductor switching device including a first and second FET having two signal electrodes and a gate electrode formed on a surface of a channel layer thereof, a common input terminal, and a first and second output terminals. The common input terminal is formed by connecting one of the two signal electrodes of the first FET, either the source electrode or the drain electrode, and one of the two signal electrodes of the second FET, either the source electrode or the drain electrode. The first output terminal is another signal electrode of the first FET, and the second output terminal is another signal electrode of the second FET. The two gate electrodes are provided with control signals such that only one FET allows conduction of electric current, forming a signal circuit between the common input terminal and the first output terminal or the second output terminal. In this configuration, if the widths of the two gates of the two FETs (as defined below) are equal to or less than about 700 $\mu$m, the capacitance of the gate electrodes becomes small enough and the isolation between the two signal passes becomes large enough without the need of using shunt FETs for directing leaking input signals to the ground. Thus it is possible to reduce the chip size of a compound semiconductor switching device while maintaining low insertion loss and high isolation.

The effect of eliminating the two shunt FETs is not only evident in the size reduction of the chip but also in the reduction of the number of the parts used for assembling the device, resulting in a further reduction of the overall size of the device. In some embodiments, the size of the device has been reduced to one-fifth of the size of the conventional compound semiconductor switching device, this allowing the possibility of competing with silicon-based counterparts in the market. Furthermore, with this size, it is now possible to house the device in a smaller package (SMCP6: 1.6 mm×1.6 mm×0.75 mm) in comparison to the conventional small package (MCP6: 2.1 mm×2.0 mm×0.9 mm) of conventional compound semiconductor devices for switching.

According to other aspect of the present invention, there is provided a compound semiconductor switching device based on the above description, in which an input signal of about 2.4 GHz or higher is applied to the common input terminal, and the width of the gates of the first and second FET is about 600 $\mu$m or less. With this specified condition for the signal frequency and the gate width of the FET, the isolation between two signal passes corresponding to the first and second FET was about 18 dB or more than when using the shunt FET. Even with an input signal frequency of 3 GHz, good isolation was achieved by reducing the gate width to 300 $\mu$m.

BRIEF DESCRIPTION OF THE DRAWINGS

The present invention may be better understood, and its objects, features and advantages made apparent to those skilled in the art, by referring to the accompanying drawings.

DETAILED DESCRIPTION OF THE INVENTION

The embodiments of the present invention will be described hereinafter in reference to the accompanying drawings.

Figure 1:
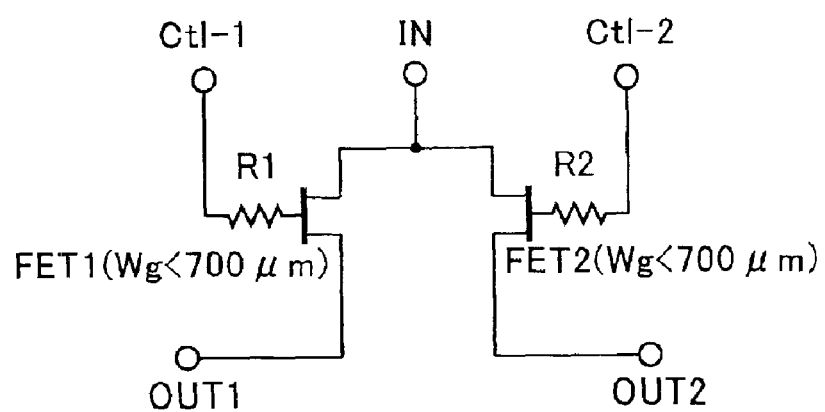
FIG. 1 is a circuit diagram used in one embodiment of the present invention.

FIG. 1 is a circuit diagram for describing the compound semiconductor switching device of the present invention. One of the two signal electrodes, which can be either a source electrode or a drain electrode, of each FET (FET1 being the first FET and FET2 being the second FET) is connected to a common electrode IN. Another of the two signal electrodes of each FET (FET1 and FET2) is connected to an output terminal (OUT1 and OUT2). The gates of FET1 and that of FET2 are connected to the control terminals Ctl-1 and Ctl-2 through resistors R1 and R2, respectively. A complementary signal is applied to the first and second control terminals, Ctl-1 and Ctl-2. When a high level signal is applied to the control terminal of an FET of the two FETs, the FET changes into an on-state and forms a signal pass from the common input terminal IN to the output terminal of the FET (OUT1 or OUT2). The role of the resistors R1 and R2 is to prevent the leaking of the high frequency signals through the gate electrodes to the DC voltage applied on the control terminals (Ctl-1 and Ctl-2), which are grounded through capacitors.

Figure 6A:
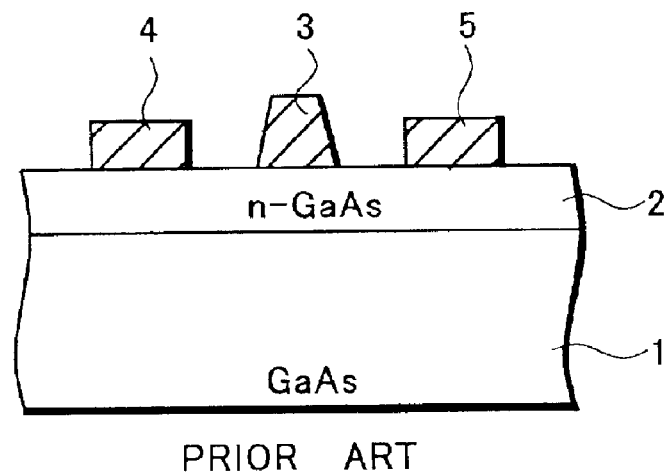
FIG. 6A is a cross-sectional view of a conventional compound semiconductor switching device.
Figure 6B:
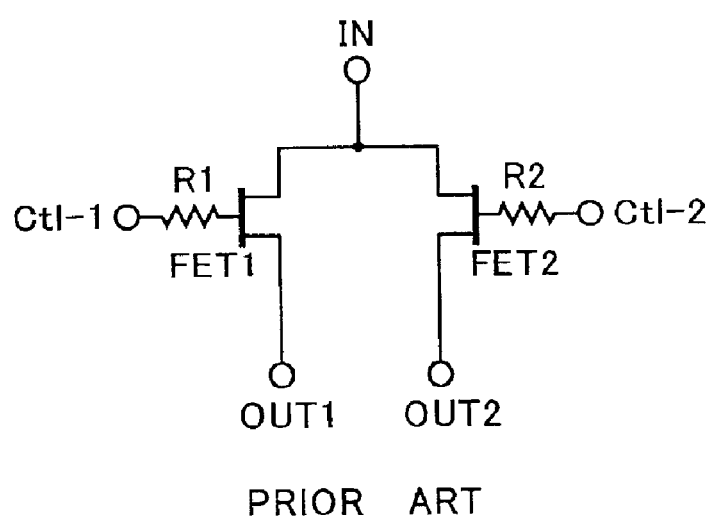
FIG. 6B is a circuit diagram of the conventional semiconductor switching device of FIG. 6A.
Figure 7:
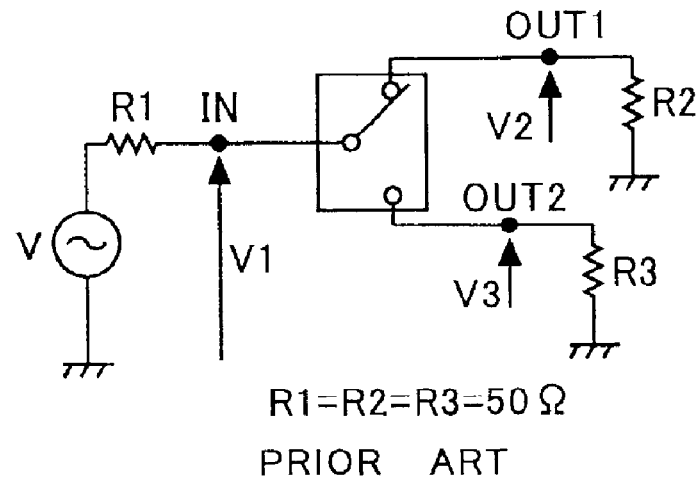
FIG. 7 is a circuit diagram for describing another conventional compound semiconductor switching device equivalent to the circuit diagram of FIG. 6B.
Figure 8:
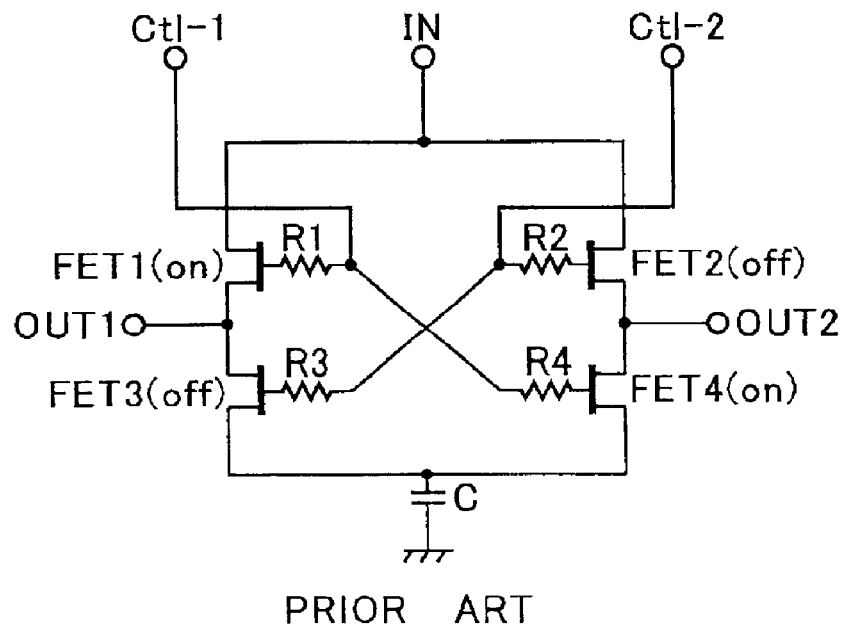
FIG. 8 is a circuit diagram for describing yet another conventional compound semiconductor switching device.

In principle, the circuit shown in FIG. 1 is similar to the basic circuit configuration of the conventional compound semiconductor switching device using GaAs FETs, shown in FIG. 6B, called SPDT (Signal Pole Double Throw). One significant difference is that the gate widths, Wg, of the FET1 and FET2 of the present invention are designed to be equal to or less than about 700 μm. In reducing the gate width, Wg, in comparison to the gate width of the conventional device, the on-state resistance becomes larger, and the parasitic capacitance generated by the Schottky contact between the gate electrode and the channel region becomes smaller as the surface area of the gate electrode (Lg×Wg) becomes smaller. This is a significant difference in the operation of the circuitry between the invention and the conventional compound semiconductor switching device.

Figure 2:
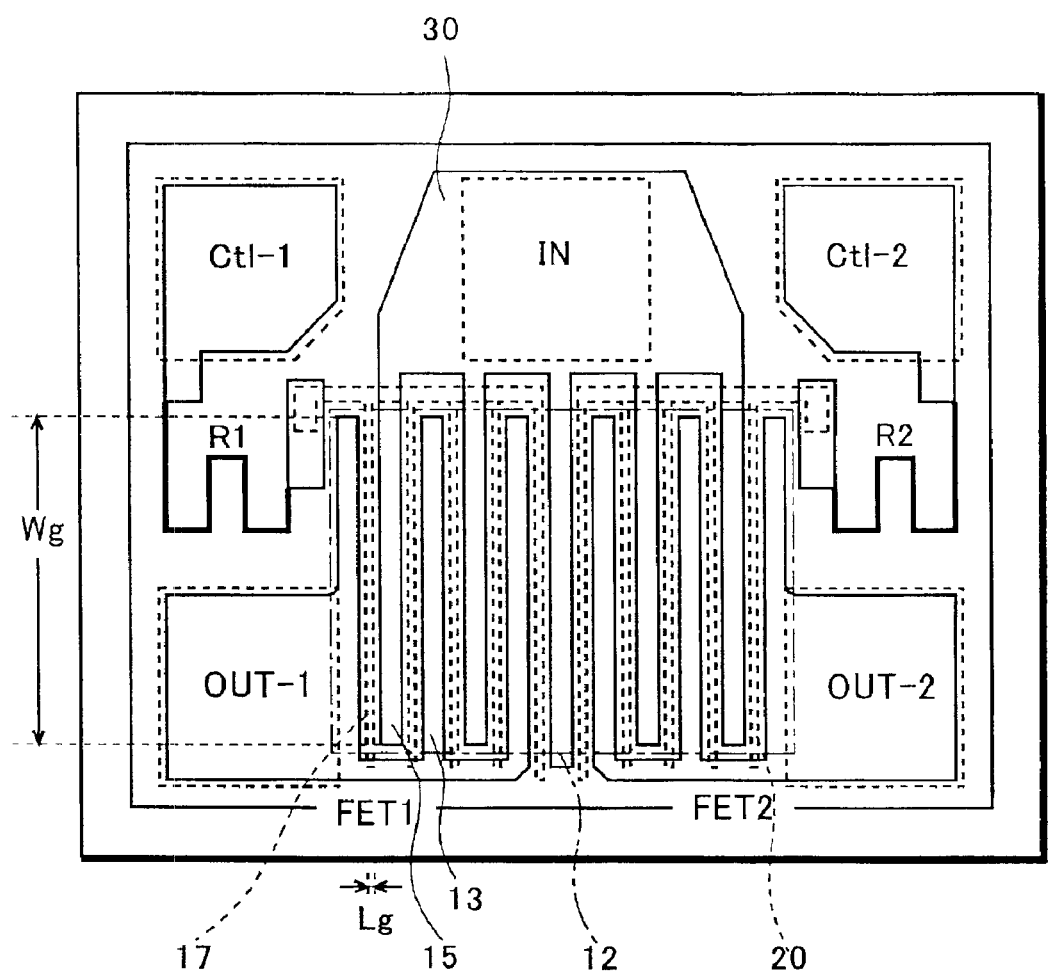
FIG. 2 is a plan view of a compound semiconductor switching device according to one embodiment of the present invention.

FIG. 2 shows a compound semiconductor chip in which the compound semiconductor switching device of the present invention is embodied as an integrated circuit.

FET1 and FET2 for the switching operation are formed in the middle of a GaAs substrate with the gate electrode of each FET being connected to the respective resistor (R1 or R2). The gate width Wg of an FET is defined as being the summation of the overlapping electrode lengths of the comb-like gate electrodes of the FET. As can be seen from FIG. 2, gate width Wg encompasses the lengths of the comb-like gate electrodes 13, 15 that overlap between adjacent electrode tips, multiplied by the number of teeth of the comb-like gate electrodes 13, 15. Connecting pads are formed in the peripheral area for the common input terminal IN, the output terminals OUT1, OUT2, and the control terminals Ctl-1, Ctl-2. The dashed lines indicate a second layer of wiring which is formed in the same processing step as the gate electrodes of the FET and includes a gate metal layer (Ti/Pt/Au) 20. A third layer of wiring indicated by the solid lines is for connecting the device elements and forming the connecting pads, and includes a pad metal layer (Ti/Pt/Au) 30. A first layer contains an ohmic metal layer (AuGe/Ni/Au) 10 making an ohmic contact to the substrate, which forms the source electrode, the drain electrode and the connecting electrodes at both edges of each resistor. In FIG. 2, the first layer is not shown, as it overlaps with the pad metal layer.

It is seen from FIG. 2 that the components of the device are FET1, FET2, the resistors R1, R2, and the connecting pads for the common input terminal IN, the output terminals OUT1, OUT2, and the control terminals Ctl-1, Ctl-2. It is apparent that the number of the device elements is minimal in comparison to that of the conventional compound semiconductor switching device, such as the one shown below in FIG. 9.

One significant feature of the present invention is that the size of the FET, either FET1 or FET2, is smaller than the size of the switching FET of the conventional device by more than 50%, since the gate width of the FET is equal to or smaller than about 700 μm, which is smaller than the gate width of the conventional device by more than 50%. FET1 is formed in the left half of the channel region 12 defined by the rectangle encircled by the dashed line. Three third layer source electrodes 13, which have a comb-like structure and extend from the bottom portion, are made of the pad metal layer 30 as the third metal layer, and are connected to the output terminal OUT1. In this configuration, the source electrodes 13 are interchangeable with the drain electrodes as one of the signal electrodes of the FET. Beneath these third layer source electrodes 13 are formed first layer source electrodes 14 (also interchangeable with the drain electrodes) which are made of the ohmic metal layer 10 as the first metal layer. Furthermore, three third layer drain electrodes 15, which have a comb-like structure and extend from the top portion, are also made of the pad metal layer 30 in the third layer, and are connected to the common input terminal IN. Again, the drain electrodes 15 are interchangeable with the source electrodes as one of the signal electrodes of the FET. Beneath these third layer drain electrodes 15 are formed first layer drain electrodes 16 (also interchangeable with the source electrodes) which are made of the ohmic metal layer 10 as the first metal layer. The two sets of signal electrodes are juxtaposed in a interleaved relationship to each other, and five gate electrodes 17, which are made of the gate metal layer 20 as the second metal layer, are formed between the teeth of the combs in the channel region 12, creating another comb-like structure. Furthermore, the drain electrode 15 of the middle tooth of the upper comb is shared by FET1 and FET2, further contributing to the size reduction of the device. Again, in this configuration, the gate width of an FET is defined as the summation of the overlapping lengths of the teeth of the gate electrode combs (overlapping length of one tooth with an adjacent tooth multiplied by number of the teeth).

Figure 10A:
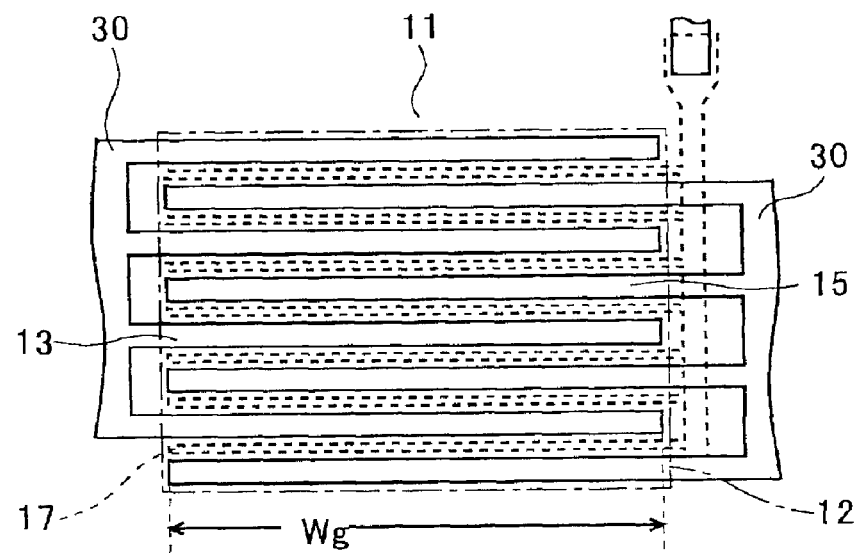
FIG. 10A is a plan view of an FET of one embodiment of the present invention.

FIG. 10A shows a plan view of the FET cut perpendicular to the teeth of the comb. The GaAs substrate 11 has an n-type channel region 12, and two heavily doped regions at both ends of the channel region 12, namely, a source region 18 and a drain region 19. The gate electrode 17, which is made of the gate metal layer 20 as the second metal layer, is formed on the surface of the channel region 12. The first layer drain electrode 14 and the first layer source electrode 16, which are made of the ohmic metal layer 10 as the first metal layer, are formed on the surface of the heavily doped regions. These two types of electrodes collectively operate as signal electrodes. On top of the first layer signal electrodes are formed the third layer signal electrodes made of the pad metal layer 30 as the third metal layer, namely the third layer drain electrode 13 and the third layer source electrode 15. This layer is responsible for wiring the device elements of the chip.

Figure 10B:
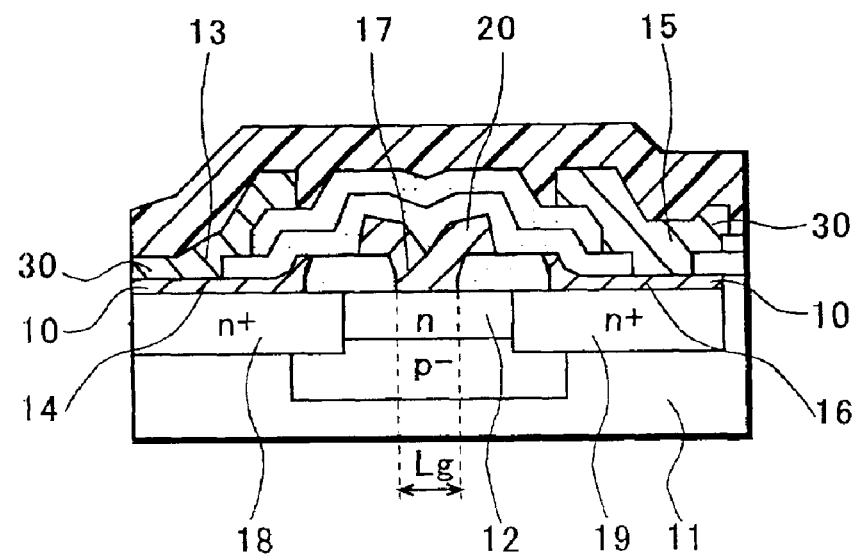
FIG. 10B is a cross-sectional view of the embodiment of FIG. 10A.

In this configuration, as shown with reference to FIG. 10B, the gate length Lg is defined as the length of the gate electrode 17 formed on the channel region 12 between the source region 15 and the drain region 13, and is normally about 0.5 μm so that the single channel effect does not occur. In the embodiment of FIGS. 10A and 10B, the gate length, Lg, was 0.5 μm and the gate width, Wg, was 600 μm.

Using the aforementioned configurations, in one embodiment of the present invention, it was possible to reduce the chip size of the compound semiconductor switching device to a mere 0.37×0.30 mm$^2$. This chip size was only about 20% of the chip size of the conventional compound semiconductor switching device For the sake of a comparison to the conventional compound semiconductor switching device, a configuration of the device based on the conventional art will be described below in reference to FIG. 9.

FET1 and FET2 for switching operation are formed in the middle of a GaAs substrate with FET1 being placed on the left and FET2 being placed on the right. Also in this configuration, the gate width of an FET is defined as being the sum of the overlapping lengths of the teeth of the gate electrode comb. Shunt FET3 and shunt FET4 are formed in the lower left and right corners of the substrate, respectively. Resistors R1, R2, R3 and R4 are connected to the gate electrodes of the respective FETs. Also formed on the fringe area of the substrate are a common input terminal IN, output terminals OUT1, OUT2, control terminals Ctl-1, Ctl-2, and a ground terminal GND. Further, the source electrodes of shunt FET3 and shunt FET4 form a unitary part, and are connected to the ground terminal GND through a capacitor C for grounding. The wiring denoted by the dashed lines is in the second metal layer, and made of a gate metal layer (Ti/Pt/Au), which is formed simultaneously with the gate electrodes of the FETs. The wiring denoted by the solid lines is in the third metal layer, and made of a pad metal layer (Ti/Pt/Au), which connects the device elements together and forms the connecting pads. In the first metal layer, an ohmic metal layer (AuGe/Ni/Au), which forms an ohmic contact to the substrate, is formed as the source electrodes, the drain electrodes, and the connecting electrodes at both ends of the resistors, As this ohmic metal layer overlaps with the pad metal layer, it is not shown in FIG. 9.

This compound semiconductor switching device was designed for 1.9 GHz signals used in the PHS (Personal Phone System). The gate width, Wg, of the FET1 and the FET2 was 1400 μm, and that of the shunt FET3 and FET4 was 400 μm. The gate length, Lg, was very close to 0.5 μm so that the on-state resistance of the FET was minimal.

Figure 9:
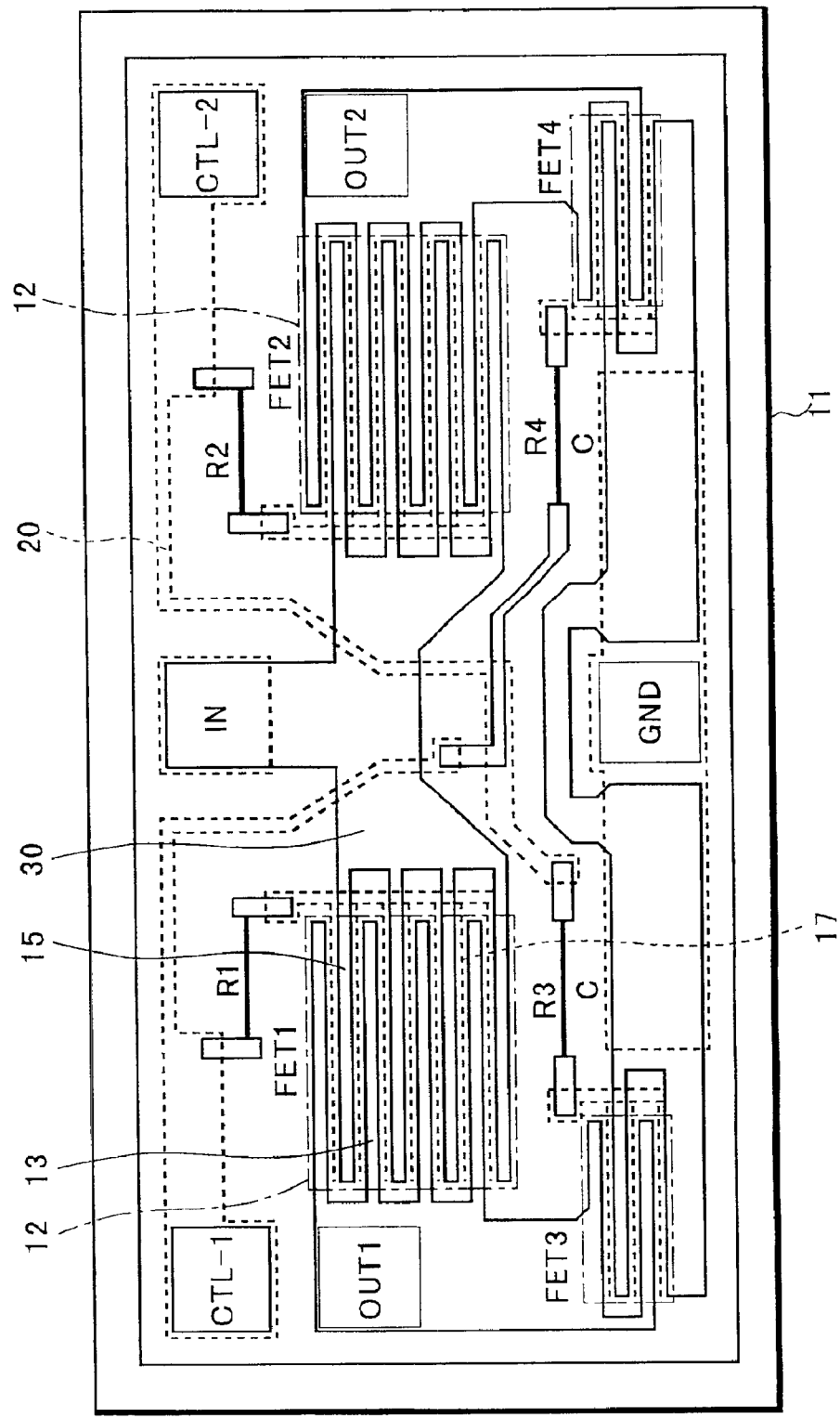
FIG. 9 is a plan view of a conventional compound semiconductor switching device for comparison with FIG. 2.

A simple comparison between FIG. 2 and FIG. 9 shows that the compound semiconductor switching device of the present invention is much smaller than the conventional device. One of the measures to compare the sizes is that the gate width of the FET of the device of the present invention is smaller than one half of the gate width of the switching FET of the conventional device. The comparison also shows that the number of the device elements is significantly smaller than that of the conventional device. In the conventional device, there are a lot of additional device elements, which are not required in the device of the present invention, including shunt FETs, capacitors, ground terminals, and additional resistors.

Now, explanation will be given on how proper isolation and proper insertion loss are achieved at the signal frequencies above about 2.4 GHz under the specified condition of the gate width of the FET without using shunt FETs.

Figure 3:
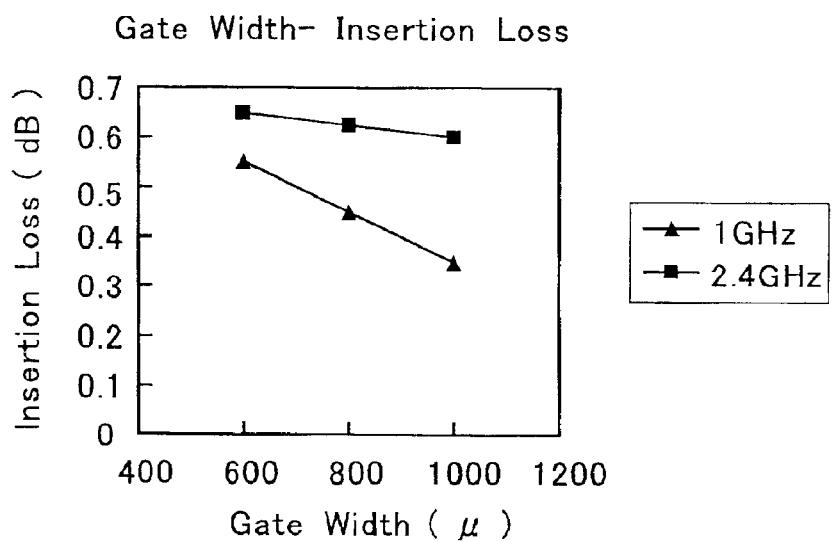
FIG. 3 is a graph of insertion loss as a function of gate width in one embodiment of the present invention.

FIG. 3 shows insertion loss as a function of the gate width, Wg, of the FET when the gate length, Lg, is about 0.5 μm.

When the signal frequency was 1 GHz, the insertion loss increased from 0.35 dB to 0.55 dB by 0.2 dB as the gate width, Wg, decreased from 1000 μm to 600 μm. However, at the signal frequency of 2.4 GHz, the insertion loss increased only by 0.05 dB from 0.60 dB to 0.65 dB for the same reduction of the gate width, Wg, from 1000 μm to 600 μm. This was because the effect of the on-state resistance of the FET on the insertion loss was significant at a signal frequency of 1 GHz, but the same effect was much less significant at a signal frequency of 2.4 GHz.

One theory we have considered to account for the aforementioned effect of the signal frequency on the insertion loss, by which we do not intend to be bound in this description, is that the capacitance generated at the gate of the FET becomes more pronounced and eventually surpasses the on-state resistance of the FET as the major contributing factor to the insertion loss with the increase in the frequency from 1.0 to 2.4 GHz. As a result, we have concluded that the capacitance, which gives rise to the reduction of the isolation, rather than the on-resistance, should be considered first in establishing low insertion loss when the signal frequency is above about 2.4 GHz. This approach is the opposite of the conventional designing guideline for the compound semiconductor switching device.

Figure 4:
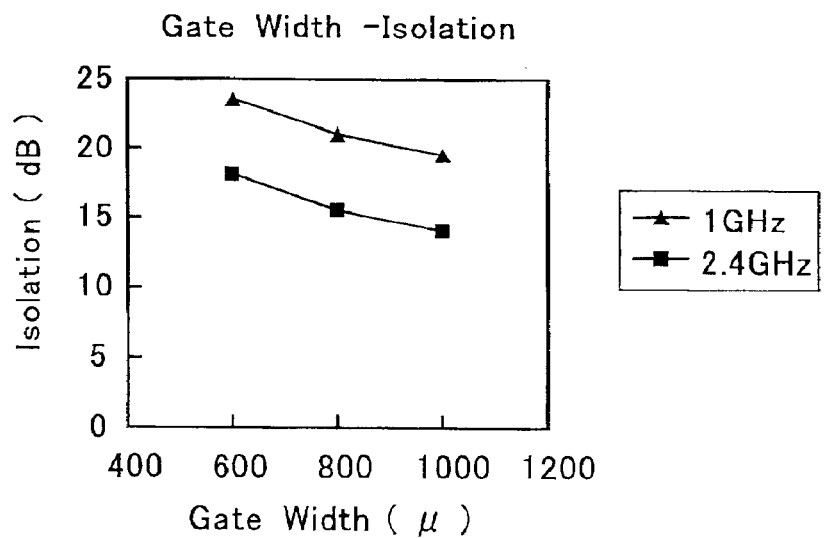
FIG. 4 is a graph of isolation as a function of gate width in one embodiment of the present invention.

FIG. 4 shows isolation as a function of the gate width, Wg, of the FET when the gate length, Lg, is about 0.5 μm.

When the signal frequency was 1 GHz, the isolation increased from 19.5 dB to 23.5 dB by 4.0 dB as the gate width, Wg, decreased from 1000 μm to 600 μm. Similarly, at the signal frequency of 2.4 GHz, the isolation also increased from 14 dB to 18 dB by 4 dB for the game reduction in gate width, Wg, from 1000 μm to 600 μm. This was because the isolation improved with the reduction of the capacitance of the gate electrode.

From the discussion above, it is apparent that the chip size of a compound semiconductor switching device can be reduced by assuring high isolation first, which is essentially making the gate width, Wg, smaller as shown in FIG. 4, since the insertion loss does not change much, as shown in FIG. 3, depending on the gate width, Wg, at a signal frequency equal to or higher than about 2.4 GHz. It is possible to achieve isolation equal to or higher than 16.5 dB at the signal frequency of 2.4 GHz, when the gate width, Wg, was equal to or less than 700 μm. The isolation was equal to or higher than 18 dB when the gate width, Wg, was equal to or less than 600 μm at the same signal frequency.

In the compound semiconductor switching device of the present invention shown in FIG. 2, FET 1 and FET 2 had a gate length of 0.5 μm and a gate width, Wg, of 600 μm, and insertion loss of 0.65 dB and isolation of 18 dB were achieved. The characteristics of this device are suitable for a communication-switching device in the application of the spectrum-spread communication technology which utilizes 2.4 GHz range ISM Band (Industrial, Scientific, and Medial frequency Band) including Bluetooth (a specification for improving the amenities of mobile terminals and business-use computers by connecting mobile telephones, laptop computers, hand-held information terminals, digital cameras, and their peripherals using wireless communication means).

Figure 5:
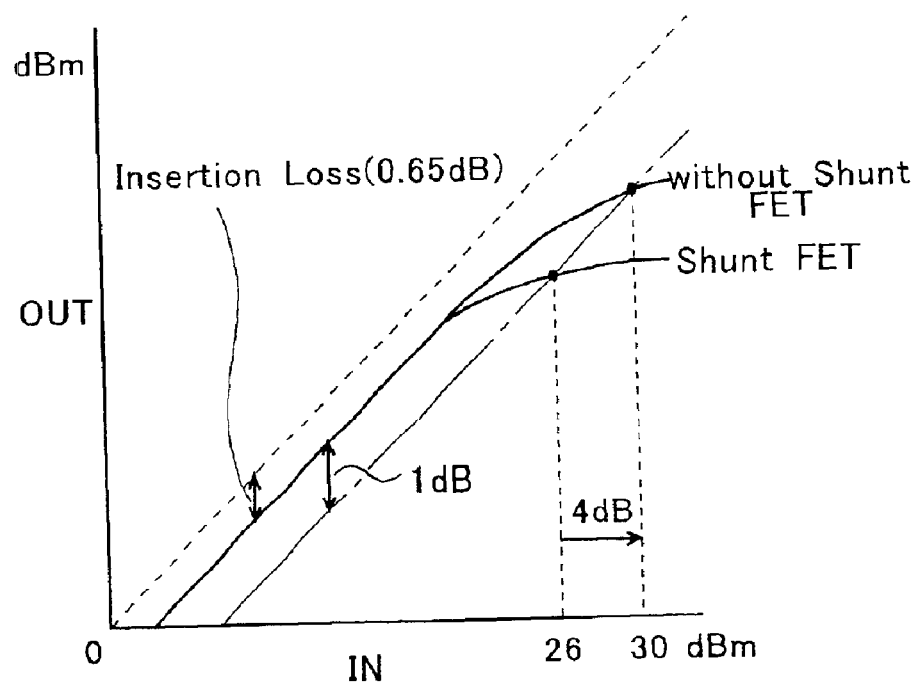
FIG. 5 is a characteristic diagram describing the deviation from linearity between input and output power in one embodiment of the present invention.

Other improvements have been made to the circuit characteristics of the compound semiconductor switching device of the present invention. The first is that a VSWR (Voltage Standing-Wave Ratio) of 1.1 to 1.2 was achieved. VSWR is a measure of the reflection of the high frequency input power from a switching portion of a device. Specifically, VSWR is the ratio between the maximum and the minimum of a voltage standing wave which is generated by an incoming wave and a reflecting wave at a discontinuous portion of a transmission line of high frequency signal. At an ideal condition without any reflection, VSWR is equal to 1. The VSWR value obtained with the device of the present invention provides a significant improvement over the conventional compound semiconductor switching device with the shunt FETs, the VSWR value of which is about 1.4. This was achieved as the compound semiconductor switching device of the present invention has only two switching FETs along the transmission line of high frequency signal, making the circuit configuration simpler. The smaller size of the FETs also contributed to the reduction of the reflection. The second improvement is that $P_{IN}1$ dB of devices in accordance with the present invention is 30 dB. $P_{IN}1$ dB is a measure of the linearity between the input high frequency signal and the output signal, which is shown in FIG. 5. In the ideal case, the ratio between the input and output power is 1. However, in actual cases, the output power decreases due to the inevitable insertion loss. Since the output power deviates from the linearity with the increase of the input power, $P_{IN}1$ dB is defined as the point where the output power is smaller than the input power by a summed amount of the insertion loss in the linearity region and 1 dB. While $P_{IN}1$ dB was 26 dB for the conventional compound semiconductor switching device with shunt FETs, the value was 30 dB for the compound semiconductor switching device without shunt FETs of the present invention. This difference of 4 dB is significant because, in the conventional device with shunt FETs, the linearity suffers from both pinch-off voltages of the switching FET and the shunt FET at off-state, while in the device of the present invention without shunt FETs, only the switching FET in an off-state affects the linearity.

Figure 11:
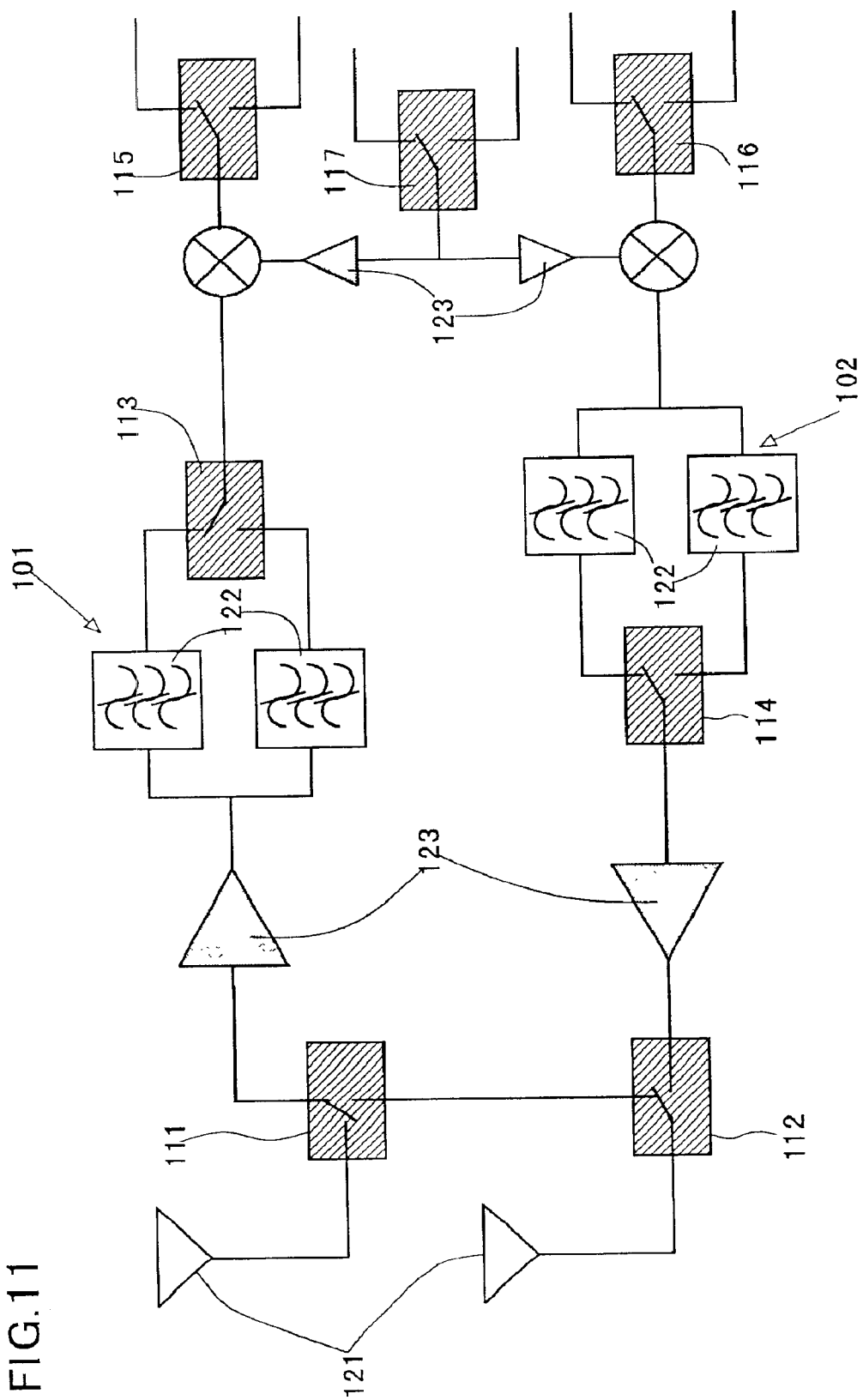
FIG. 11 is a schematic view of an embodiment of the invention in which the compound semiconductor switching device is used for a mobile telephone.

FIG. 11 shows an embodiment in which the switching device of the invention is applied to mobile telephone circuitry. Reference numerals 111–117 indicate switching devices according to the invention. A diversity switch 111 is used for switching between two antennas 121. One of the antennas is disposed outside the housing of the mobile telephone, and another antenna is contained inside the housing. The two antennas are alternated by the diversity switch 111 for obtaining better antenna orientation with respect to the signal wave. An input/output switch 112 is used for switching between a receiving circuit 101 and a transmitting circuit 102. Any wireless telephone, either a mobile telephone or a wireless receiver of a stationary telephone, needs the input/output switch 112 for switching at a high rate between the two circuits while the telephone is in use. A filter switch 113 is used for switching between two filters 122 of the receiving circuit 101 within the frequency band being used. When a 2.4 GHz band, for example, is used for receiving and transmitting signals, two frequencies are chosen for receiving and transmitting the signals. The quality of signal reception and transmission is improved by switching between two filters 122, each corresponding to the respective signal frequency. An IF (intermediate frequency) band switch 115 is used for switching between two IF bands in the receiving circuit 101. An IF band is a frequency band down-converted from the high frequency band, and is used for frequency modulation within a silicon based device. In this embodiment, the IF band is 300 MHz. For example, TDMA (IS136) proposes that two IF bands be used. The next generation CDMA also requires that two IF bands be used for GPS and CDMA respectively. GPS is used for positional recognition of the mobile telephone. The IF band switch 115 switches between these bands. A filter switch 114 and an IF band switch 116 of the transmitting circuit 102 have similar functions as described above for the filter switch 113 and band switch 115 of receiving circuit 101, respectively. A local switch 117 is used for switching between two local signals. For example, when a receiving frequency of 1.9 GHz is used in a PHS system, a local signal of 1.6 GHz is used for generating an IF signal of 300 MHz. When transmitting, the IF signal is up-converted to 1.95 GHz using a local signal of 1.65 GHz. With the slightly different frequencies for the reception and transmission of the signal, it is possible to prevent the generation of a beat between the two signals. In FIG. 11, reference numeral 123 indicates an amplifier for amplifying the signal and the reference numeral 124 indicates a mixing circuit. Other applications of the switching device of the invention include switches for Bluetooth devices and switches for computers and other wireless LAN equipment.

While the invention has been described and illustrated with respect to a few embodiments, it will be understood by those skilled in the art that various other changes and modifications may be made without departing from the spirit and scope of the invention. All such modifications are intended for inclusion within the scope of the following claims.

What is claimed is:

1. A compound semiconductor switching device comprising:
   a first FET comprising signal electrodes and a gate electrode formed on a surface of a channel layer of said first FET, the signal electrodes of the first FET not being connected to each other;
   a second FET comprising signal electrodes and a gate electrode formed on a surface of a channel layer of said second FET, the signal electrodes of the second FET not being connected to each other;
   a common input terminal, said common input terminal being formed by connecting one of the signal electrodes of the first FET and one of the signal electrodes of the second FET;
   a first output terminal, said first output terminal being the signal electrode of the first FET not used as the common input terminal; and
   a second output terminal, said second output terminal being the signal electrode of the second FET not used as the common input terminal;
   wherein the gate electrodes of the first and second FET's are provided with control signals such that only one FET allows conduction of electric current so that a signal pass is formed between the common input terminal and either the first output terminal or the second output terminal; and
   wherein the first FET and the second FET have gate widths of about 700 μm or less and are not connected to a shunt FET.

2. A compound semiconductor switching device according to claim 1, wherein an input signal of about 2.4 GHz or higher is applied to the common input terminal, and the first FET and the second FET have gate widths of about 600 μm or less.

3. A compound semiconductor switching device according to claim 1, further comprising a GaAs substrate used as a semi-insulating substrate for forming the channel layer on a surface thereof.

4. A compound semiconductor switching device according to claim 1, wherein the gate electrodes and the channel layers of the first FET and the second FET form respective Schottky contacts, and wherein the signal electrodes and the channel layers of the first FET and the second FET form respective ohmic contacts.

5. A compound semiconductor switching device according to claim 1, wherein the signal electrodes of the first FET are a source electrode and a drain electrode of the first FET, and the signal electrodes of the second FET are a source electrode and a drain electrode of the second FET.

6. A compound semiconductor switching device according to claim 1, wherein an input signal of about 2.4 GHz or higher is applied to the common input terminal, and the gates widths of the first FET and the second FET are about 600 μm or less;
   wherein a GaAs substrate is used as a semi-insulating substrate for forming the channel layer on a surface thereof; and
   wherein the signal electrodes of the first FET are a source electrode and a drain electrode of the first FET, and the signal electrodes of the second FET are a source electrode and a drain electrode of the second FET.

7. A compound semiconductor switching device according to claim 1, wherein the common input terminal is configured to receive an input signal between about 2.4 GHz and about 3.0 GHz.

8. A compound semiconductor switching device according to claim 1, wherein the gate widths of the first FET and the second FET are greater than or equal to 300 μm.

9. A mobile communication device, comprising:
- an antenna for receiving and sending an electromagnetic signal;
- a signal receiving circuit for receiving the signal through the antenna;
- a signal transmitting circuit for sending the signal through the antenna; and
- at least one compound semiconductor switching device, said compound semiconductor switching devices comprising:
  - a first FET comprising signal electrodes and a gate electrode formed on a surface of a channel layer of said first FET, the signal electrodes of the first FET not being connected to each other;
  - a second FET comprising signal electrodes and a gate electrode formed on a surface of a channel layer of said second FET, the signal electrodes of the second FET not being connected to each other;
  - a common input terminal, said common input terminal being formed by connecting one of the signal electrodes of the first FET and one of the signal electrodes of the second FET;
  - a first output terminal, said first output terminal being the signal electrode of the first FET not used as the common input terminal; and
  - a second output terminal, said second output terminal being the signal electrode of the second FET not used as the common input terminal;
  - the gate electrodes of the first and second FET's being provided with control signals such that only one FET allows conduction of electric current so that a signal pass is formed between the common input terminal and either the first output terminal or the second output terminal; and
  - the first FET and the second FET having gate widths of about 700 μm or less and not being connected to a shunt FET;
- wherein the compound semiconductor devices are configured within the mobile communication device for switching between the signal receiving circuit and the signal transmitting circuit.

10. A mobile communication device according to claim 9, further comprising a second antenna, an antenna switch comprising one of said compound semiconductor switching devices for changing between the antenna and the second antenna for better reception or transmission of the signal, a filter switch comprising one of said compound semiconductor switching devices for changing between a filter for receiving the signal or for transmitting the signal and a band switch comprising one of said compound semiconductor switching devices for changing an IF band for receiving the signal or for transmitting the signal.

11. A mobile communication device according to claim 9, further comprising specialized circuitry for a mobile telephone, a Bluetooth device or a wireless LAN.

* * * * *